United States Patent [19]

Tsuchiya et al.

[11] Patent Number: 4,774,544
[45] Date of Patent: Sep. 27, 1988

[54] COUNTER APPARATUS FOR AN IMAGE FORMING APPARATUS FOR COUNTING AND MANAGING THE NUMBER OF IMAGE FORMING OPERATIONS

[75] Inventors: Shizuo Tsuchiya; Toshio Nagasaka, both of Tokyo, Japan

[73] Assignees: Casio Computer Co., Ltd.; Casio Electronics Manufacturing, Ltd., both of Tokyo, Japan

[21] Appl. No.: 113,325

[22] Filed: Oct. 28, 1987

Related U.S. Application Data

[63] Continuation of Ser. No. 13,231, Feb. 10, 1987, abandoned.

[30] Foreign Application Priority Data

Feb. 28, 1986 [JP] Japan ................................ 61-44330

[51] Int. Cl.$^4$ ............................................ G03G 21/00
[52] U.S. Cl. .............................. 355/14 C; 355/14 CU; 355/14 SH; 355/3 SH; 377/15
[58] Field of Search .............. 355/14 C, 14 CU, 14 R, 355/14 SH, 3 SH; 377/2, 15, 16

[56] References Cited

U.S. PATENT DOCUMENTS 4,531,826 7/1985 Stoughton et al. ............ 355/14 CU

FOREIGN PATENT DOCUMENTS 54-29643 3/1979 Japan .
57-163276 10/1982 Japan .
59-61854 4/1984 Japan .
60-133465 7/1985 Japan .
61-147267 7/1986 Japan .
62-27759 2/1987 Japan .
62-27757 2/1987 Japan .
62-27758 2/1987 Japan .

Primary Examiner—R. L. Moses
Attorney, Agent, or Firm—Nixon & Vanderhye

[57] ABSTRACT

In a counter apparatus for an image forming apparatus according to the present invention, which counts and manages the number of image forming operations, data which is ultimately written is retrieved from data stored in an EEPROM, and the retrieved data is set in a RAM counter as an initial value. The RAM counter performs a count-up operation for each printing operation for production of new data. The new data is written in the EEPROM for each production, so that a count value when a power source is turned off is held therein. In the EEPROM, a plurality of unit areas are continuously provided and are used as data write areas. The new data is sequentially written for each unit area. Thus, the number of write operations for the unit areas is decreased, so that the EEPROM which has a limited number of times of write access can constitute the counter apparatus together with the RAM counter.

20 Claims, 12 Drawing Sheets

F I G. 8B
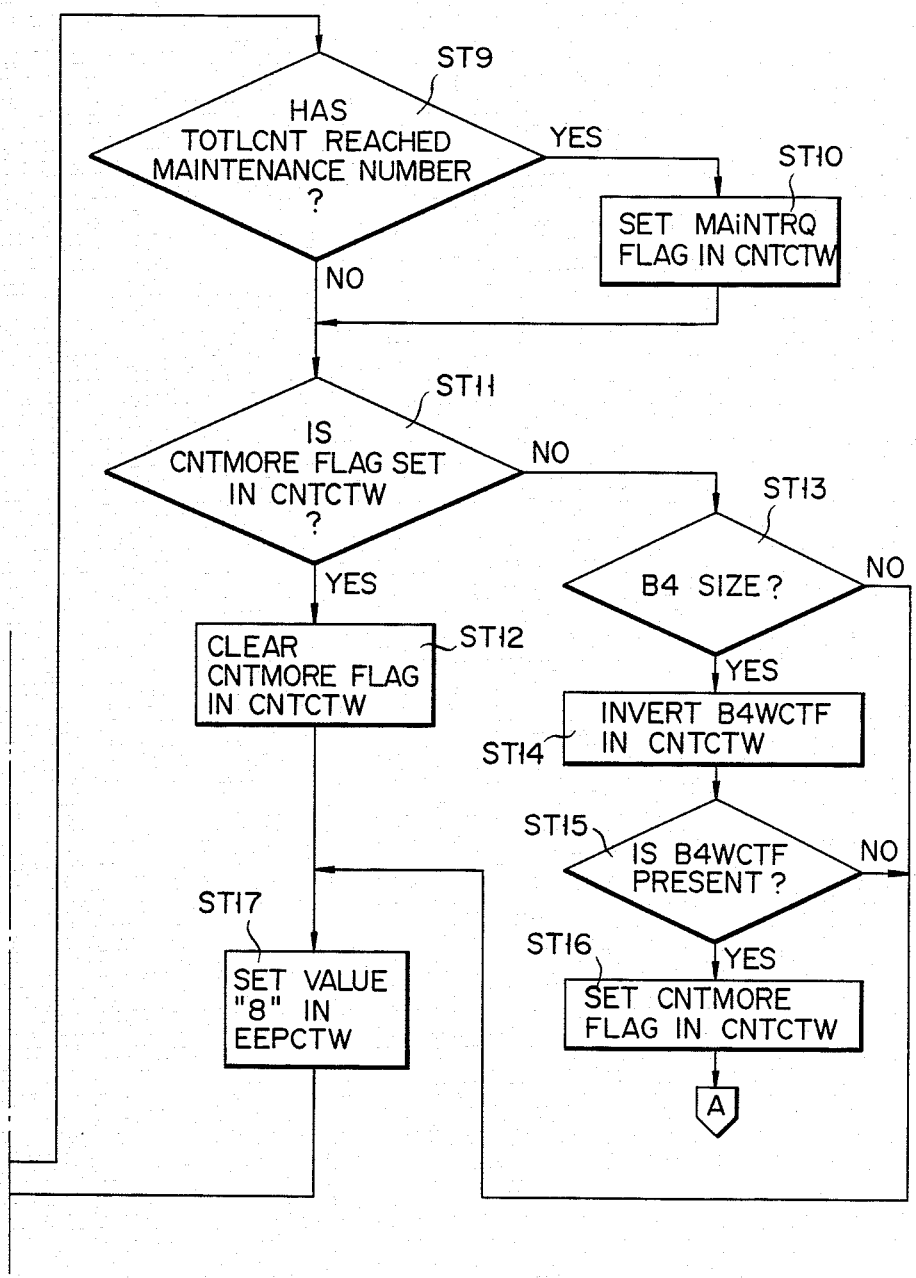

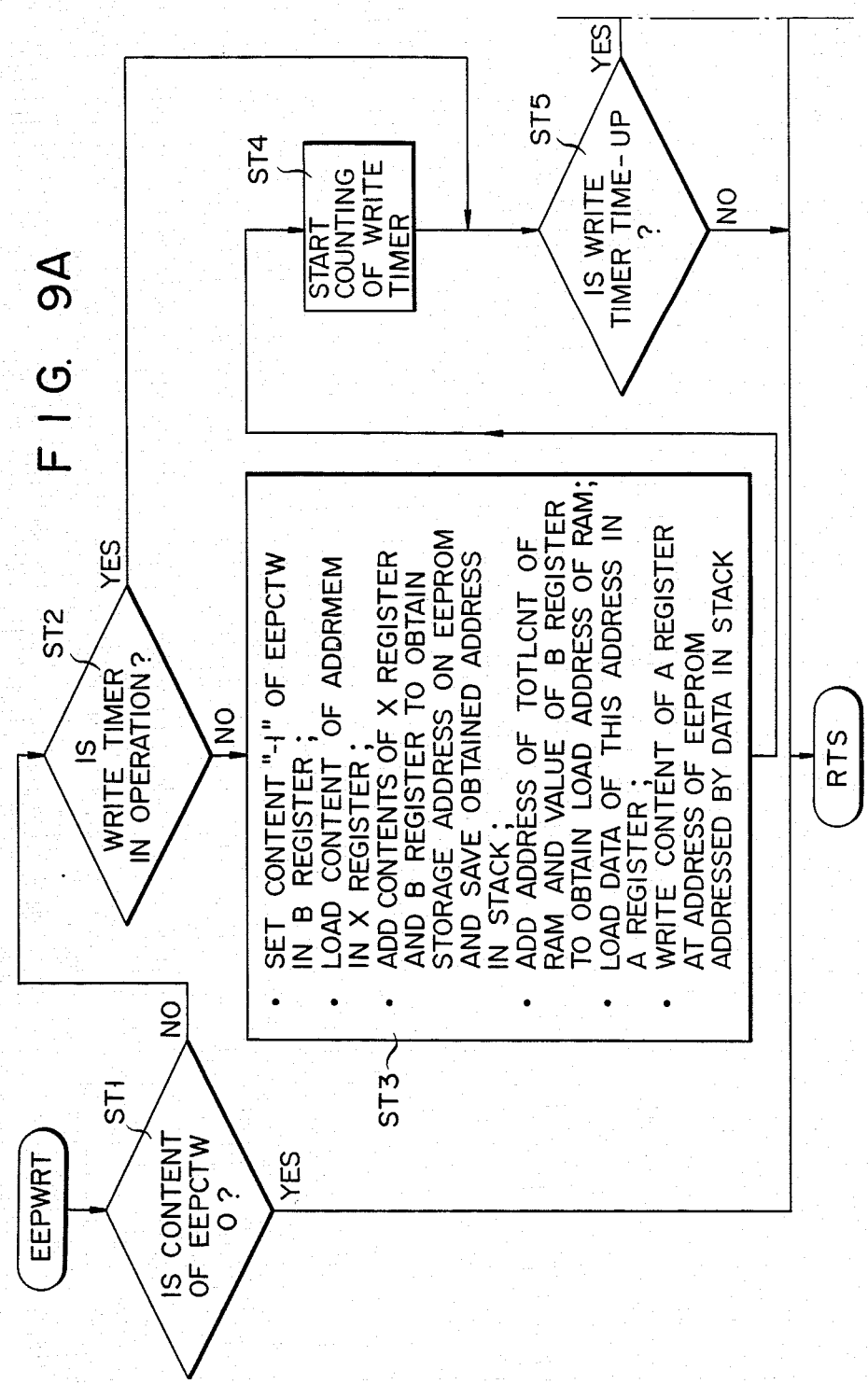

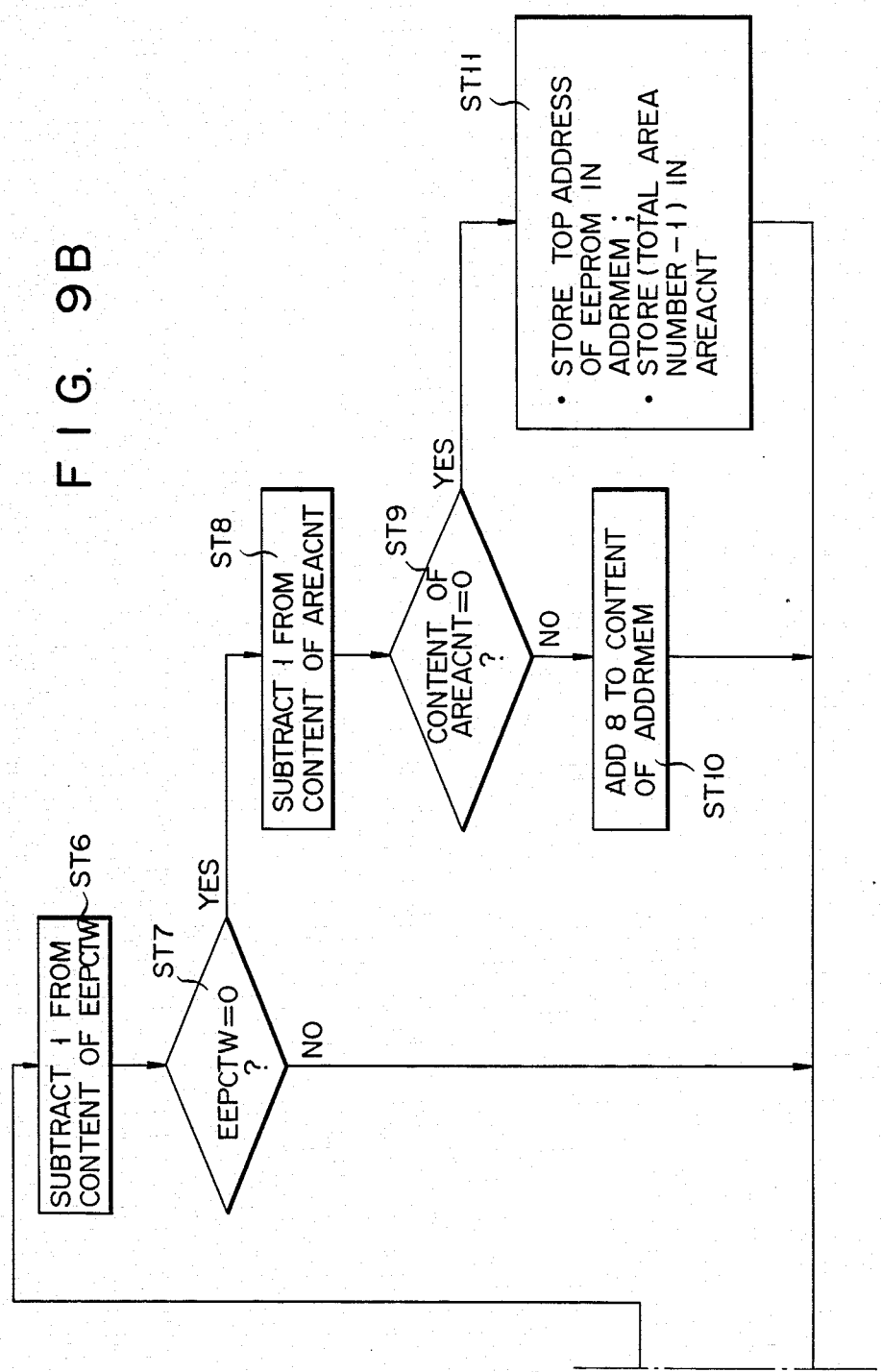

COUNTER APPARATUS FOR AN IMAGE FORMING APPARATUS FOR COUNTING AND MANAGING THE NUMBER OF IMAGE FORMING OPERATIONS

This is a continuation of application Ser. No. 13,231, filed Feb. 10, 1987, now abandoned.

BACKGROUND OF THE INVENTION

The present invention relates to a counter apparatus, which is best suitable for counting the number of prints in, e.g., an electrophotographic copying machine, for counting and managing the number of image forming operations.

A mechanical counter as a combination of an electromagnetic counter and a cam is conventionally used as the apparatus of this type. Recently, an electronic counter which is controlled by a microcomputer is becoming popular. For example, Japanese Patent Disclosure No. 60-133465 has been proposed as the prior art. In this art, a RAM is used as electronic memory means to store a total number of copies. In an apparatus described in Japanese Patent Disclosure No. 59-61854, the number of times of use of each image forming unit is individually stored in a nonvolatile RAM. This memory means loses data when a power source is turned off, and requires a backup power source to protect data. In an apparatus described in Japanese Patent Disclosure No. 57-163276, the number of prints is individually stored in a counter circuit for each image forming unit, and this counter circuit also requires a backup power source. When such a backup power source, e.g., a battery, is used, the battery must be periodically replaced due to its limited life and a user often forgets to replace it, resulting in inconvenience. While the main power source is in an off state, access to a RAM as memory means must be inhibited. When the RAM is incorporated in a CPU, the CPU must be set in a standby state and only the RAM must be set in the sleep state while being backed up. Thus, a specific sequence is required for turning on and off the main power source. When the backup power source is used, a period of time for saving data in the RAM is necessary. More specifically, the voltage of the main power source is monitored and before the main power source is completely turned off, the processing for saving the data in the RAM must be performed. For this reason, the arrangement of the apparatus becomes complicated, and this results in a high manufacturing cost. In contrast to this, an EPROM which does not require an additional power source can be used. However, in this case, in order to erase storage data, ultraviolet rays must be radiated for about 5 minutes, which is inconvenient for a frequently used machine.

SUMMARY OF THE INVENTION

The present invention has been made in consideration of the above situation, and has as its object to provide a counter apparatus for an image forming apparatus, for counting and managing the number of image forming operations, wherein no backup battery is necessary, the arrangement of the apparatus can be simplified, and data loss can be prevented.

In order to achieve the above object, there is provided a counter apparatus of the present invention comprising an EEPROM capable of reading/writing data, signal generating means for generating an execution signal of one image forming operation each time the execution of one image forming cycle for forming one image is completed, arithmetic operation means for repeating an arithmetic operation corresponding to an image forming operation using data read out from the EEPROM as an initial value, in response to a signal from the signal generating means, and processing means for supplying an instruction for reading out data stored in the EEPROM and an instruction for writing an arithmetic operation result obtained by the arithmetic operation means in the EEPROM.

With the above arrangement, in the counter apparatus for the image forming apparatus for counting and managing the number of image forming operations according to the present invention, the EEPROM is used as a storage means for storing a count value. Therefore, a backup battery and a power source sequence accompanied by change of power source can be omitted, and the arrangement can be considerably simplified. Although no backup battery is necessary, data will not be lost under any circumstances, and data can be reliably protected.

BRIEF DESCRIPTION OF THE DRAWINGS

FIGS. 7A, 7B and 7C are flow charts for explaining the operation of the CPU in order to read out count data stored in the EEPROM to a count area of the RAM when a power source is turned on;

FIGS. 8A and 8B are flow charts for explaining the count-up operation of the RAM; and FIGS. 9A and 9B are flow charts for explaining the operation for writing data stored in the RAM in the EEPROM.

DETAILED DESCRIPTION OF THE INVENTION

An embodiment of the present invention will now be described with reference to the accompanying drawings.

Figure 1:
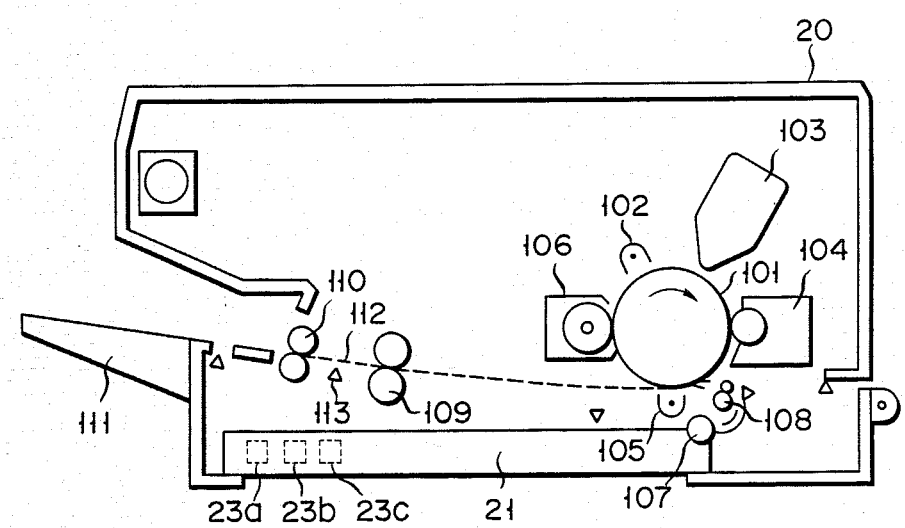
FIG. 1 is a schematic view of an electrophotographic copying machine.
Figure 2:
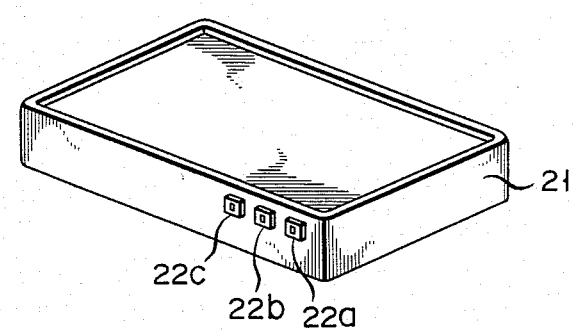
FIG. 2 is a perspective view of a paper cassette shown in FIG. 1.

FIG. 1 is a schematic view of an electrophotographic copying machine for exemplifying a case wherein a counter apparatus of the present invention is applied to the electrophotographic copying machine. Referring to FIG. 1, charger 102, image exposure device 103, developer 104, transfer device 105, and cleaning device 106 are disposed around photosensitive body 101 which is rotated in a direction indicated by the arrow shown in FIG. 1. Photosensitive body 101 and cleaning device 106 constitute a replaceable unit (this unit will be referred to as a drum set hereinafter). The drum set is detachable from main body 20 of the copying machine. A developing agent used for developer 104 must be replenished. Therefore, instead of the drum set, photosensitive body 101, cleaning device 106, and additionally developer 104 can constitute a replaceable unit to be detachable from main body 20. A user mounts paper cassette 21, which stores paper sheets of a desired size, on main body 20. As shown in FIG. 2, magnets 22a to 22c are arranged on the outer wall of paper cassette 21 in order to discriminate the paper size. For example, if magnets 22a, 22b, and 22c are arranged, the paper sheet stored is a B4 size. If magnets 22a and 22b are arranged, the paper sheet is an A4 size. Lead switches 23a to 23c for detecting these magnets are arranged in main body 20 in correspondence with the positions of the respective magnets. Therefore, the paper size is detected by the magnets and the lead switches, and the detection signal is sent to CPU 1.

The image forming process of the copying machine will now be described.

The surface of photosensitive body 101 is uniformly charged in advance by charger 102. The surface is irradiated with an image beam including image data from image exposure device 103 including an optical system, so that an electrostatic latent image corresponding to the image is formed on the surface. The latent image is developed with toner by developer 104. The toner image is transferred by transfer device 105 onto a paper sheet which is fed from paper cassette 21 through paper feed roller 107 and register roller 108 at a synchronized timing. The paper sheet on which the toner image is formed is fed to fixing device 109, and the toner image is fixed on the paper sheet.

The fixed sheet is delivered onto external delivery tray 111 by delivery roller 110. Delivery sensor 113 for detecting passage of the paper sheet is arranged adjacent to paper conveyance path 112 immediately before delivery roller 110. It can thus be detected that an image forming operation for one paper sheet is completed.

A counter apparatus in the copying machine described above will now be described in detail.

Figure 3:
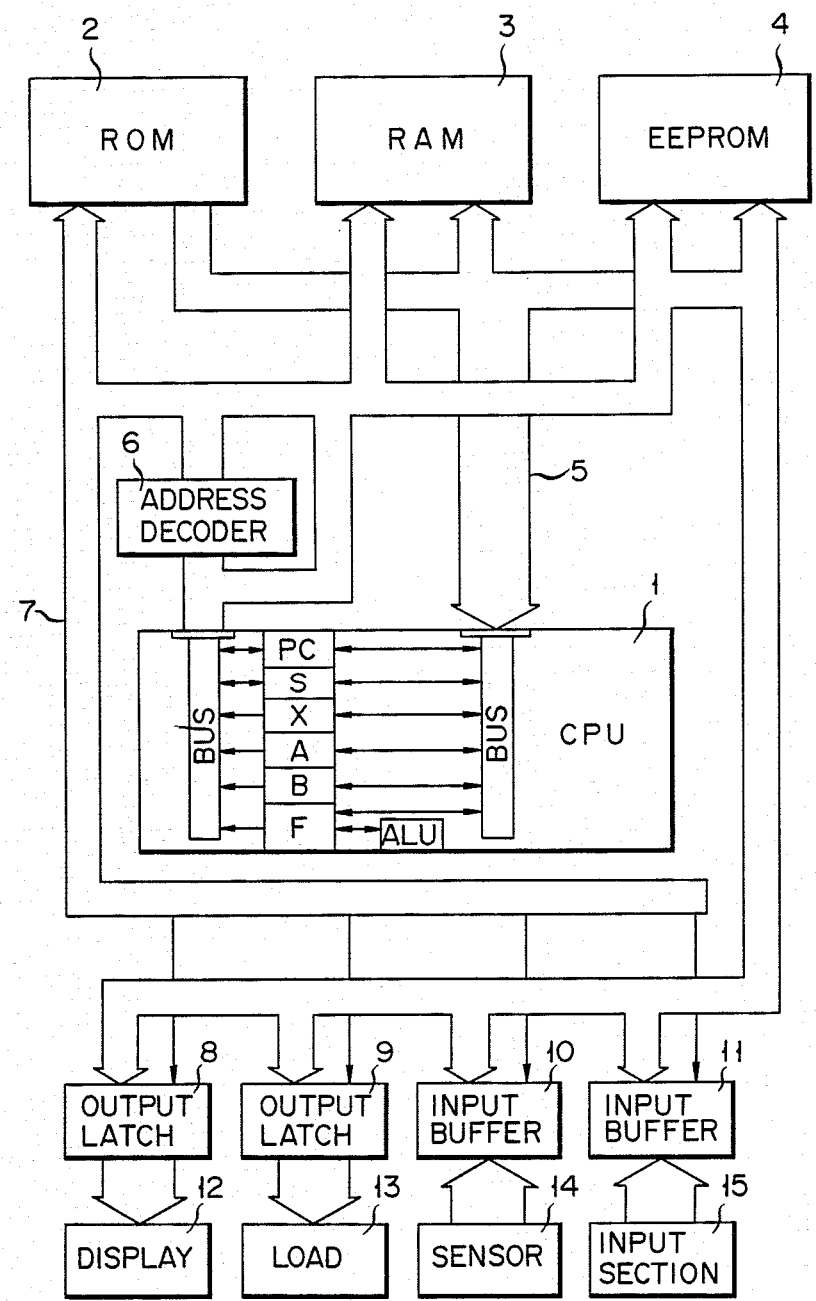
FIG. 3 is a block diagram showing a counter apparatus according to an embodiment of the present invention.

Referring to FIG. 3, reference numeral 1 denotes a CPU (Central Processing Unit), which controls the operation of the copying machine in accordance with a control program stored in ROM (Read Only Memory) 2. Reference numeral 3 denotes a RAM (Random-Access Memory); and 4, an EEPROM (Electrically Eraseable-Programmable Read Only Memory), which has a function capable of electrically erasing and writing data. As will be described later, RAM 3 and EEPROM 4 perform data communication through data bus 5, so as to constitute a counter apparatus for counting the number of prints of the copying machine. CPU 1 has program counter PC, stack S, register A, register B, register X, flag F, and arithmetic logic unit ALU, and controls, e.g., the counting operation of the number of prints in the copying machine, as described above.

Reference numeral 6 denotes an address decoder, which is connected to output latches 8 and 9 and input buffers 10 and 11 through address bus 7. An output signal from output latch 8 is input to 7-segment display 12 using light-emitting diodes, and causes it to display the number of prints upon instruction from CPU 1. An output signal from output latch 9 is supplied to load 13, i.e., respective components such as a driver for the photosensitive body, the developer, and the like for executing the electrophotographic process. Input buffers 10 and 11 receive a sensor output and the number of prints from input section 15 comprising a keyboard on a control panel. CPU 1 operates to print a preset number of times based on this input, and controls an operating condition in accordance with the sensor output.

Figure 4:
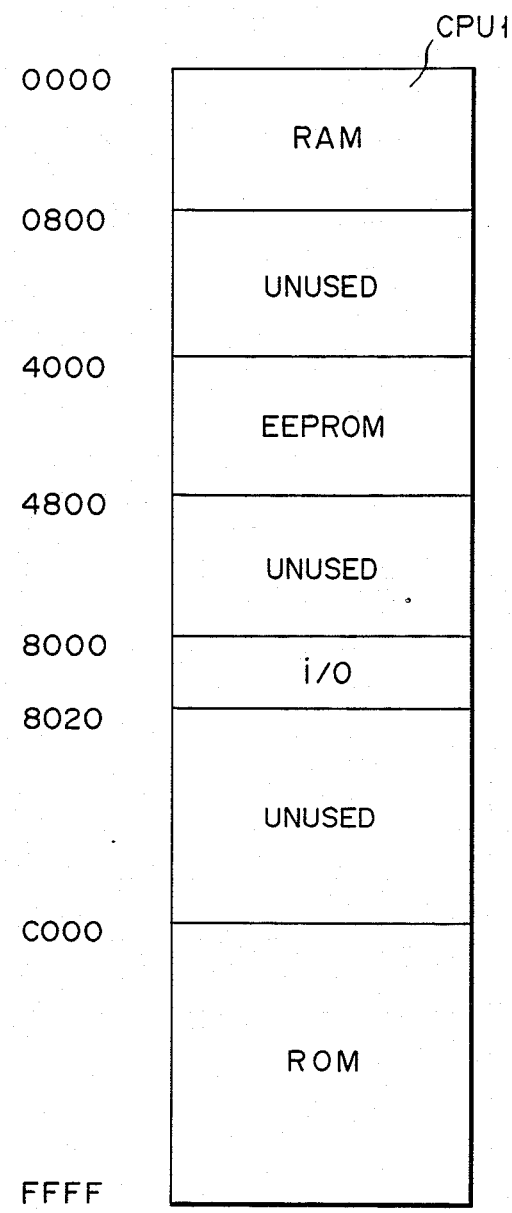
FIG. 4 is an address map of a CPU shown in FIG. 3.

FIG. 4 shows an address map of CPU 1, in which RAM 3 is allocated at addresses 0000 to 0800 and EEPROM 4 is allocated at addresses 4000 to 4800. An I/O is allocated at addresses 8000 to 8020, and ROM 2 is allocated at addresses C000 to FFFF. Other addresses are unused.

Figure 5:
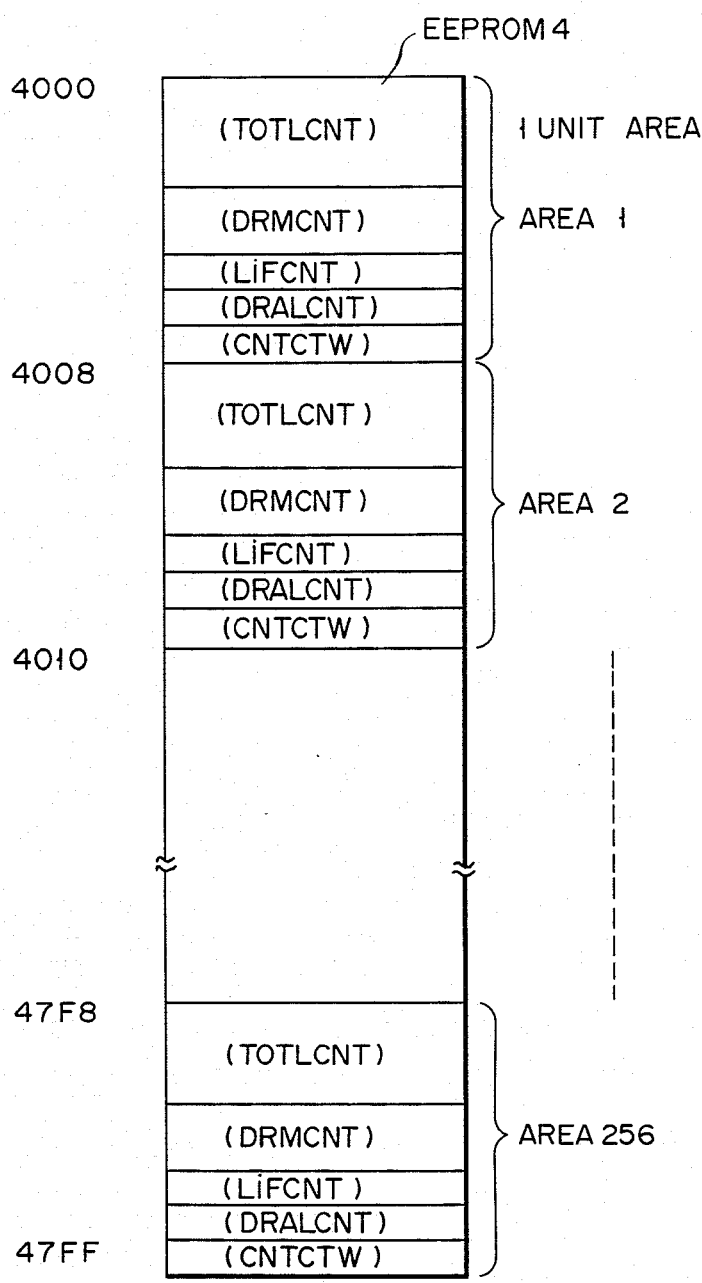
FIG. 5 is an address map of an EEPROM shown in FIG. 3.

FIG. 5 shows an address map of EEPROM 4. As shown in FIG. 5, EEPROM 4 is divided into areas 1 to 256, and has data storage areas which are indicated by TOTLCNT, DRMCNT, LiFCNT, DRALCNT, and CNTCTW in each unit area. Area TOTLCNT (total counter) stores the total number of prints of the copying machine and has 3 bytes. Area DRMCNT (drum counter) stores the number of prints on the single photosensitive body, and has 2 bytes. As shown in FIG. 1, in the copying machine, photosensitive body 101 has a predetermined service life, and cleaning device 106 and developer 104 must sometimes be replaced upon maintenance. Therefore, they are integrated to constitute an image forming unit, and the unit is often detachably arranged in the copying machine main body. In this embodiment, photosensitive body 101 and cleaning device 106 are integrated to constitute the drum set, and a frequency of use of the drum set is counted by the drum counter. When the count value reaches a predetermined value, the old drum set is replaced with a new one. Therefore, area DRMCNT stores the number of prints of the drum set to perform life management. Area LiFCNT (life counter) is used for storing a flag for managing a maintenance timing, and has one byte. Area DRALCNT (drum alarm counter) is used for producing an alarm before the service life of the drum is reached, and has one byte. Area CNTCTW (counter control word) is used for changing a count method in accordance with a paper size (one byte). In this manner, EEPROM 4 has five types of data storage areas such as TOTLCNT in one unit area consisting of 8 bytes. The current limit of a rewritable number of times of EEPROM 4 is about 10,000 times. In contrast to this the limit of the number of prints of the copying machine of this embodiment is 300,000. If count data is rewritten in EEPROM 4 for each printing operation, 300,000 times of rewriting operations are necessary. In order to solve this problem, the entire storage area of EEPROM 4 is divided into 256 areas, and the storage areas are sequentially shifted for each printing operation, so that 2,560,000 rewriting operations, i.e., 2,560,000 sheets, can be counted.

Figure 6:
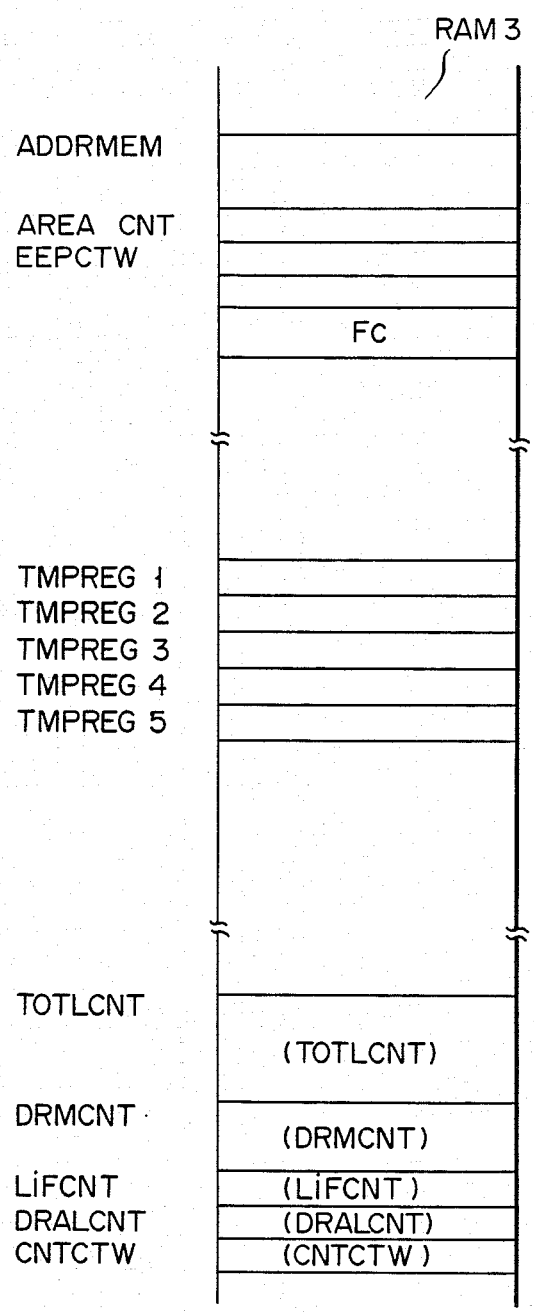
FIG. 6 is an address map of a RAM shown in FIG. 3.

FIG. 6 shows an address map of RAM 3. RAM 3 has areas indicated by ADDRMEM (address memory), AREACNT (area counter), and EEPCTW (count write of EEPROM). As will be described later, these areas are used as auxiliary temporary storage means when the number of prints of the copying machine is counted. Areas TMPREG (temporary register) 1 to 5 are similarly used as described above, and areas TOTLCNT, DRMCNT, LiFCNT, DRALCNT, and CNTCTW correspond to data denoted by the same reference symbols in EEPROM 4, and an actual count operation is performed using these counter areas.

Figure 7A:
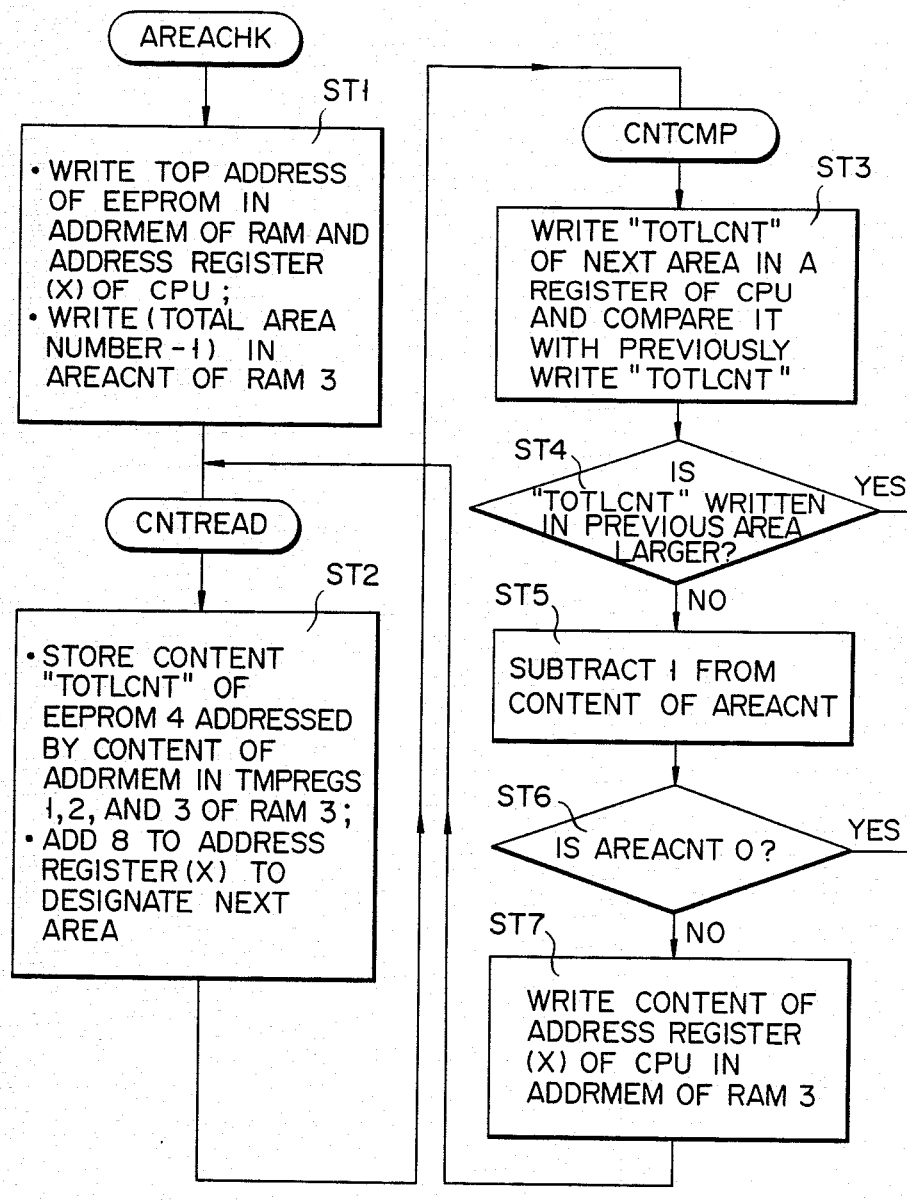
Figure 7B:
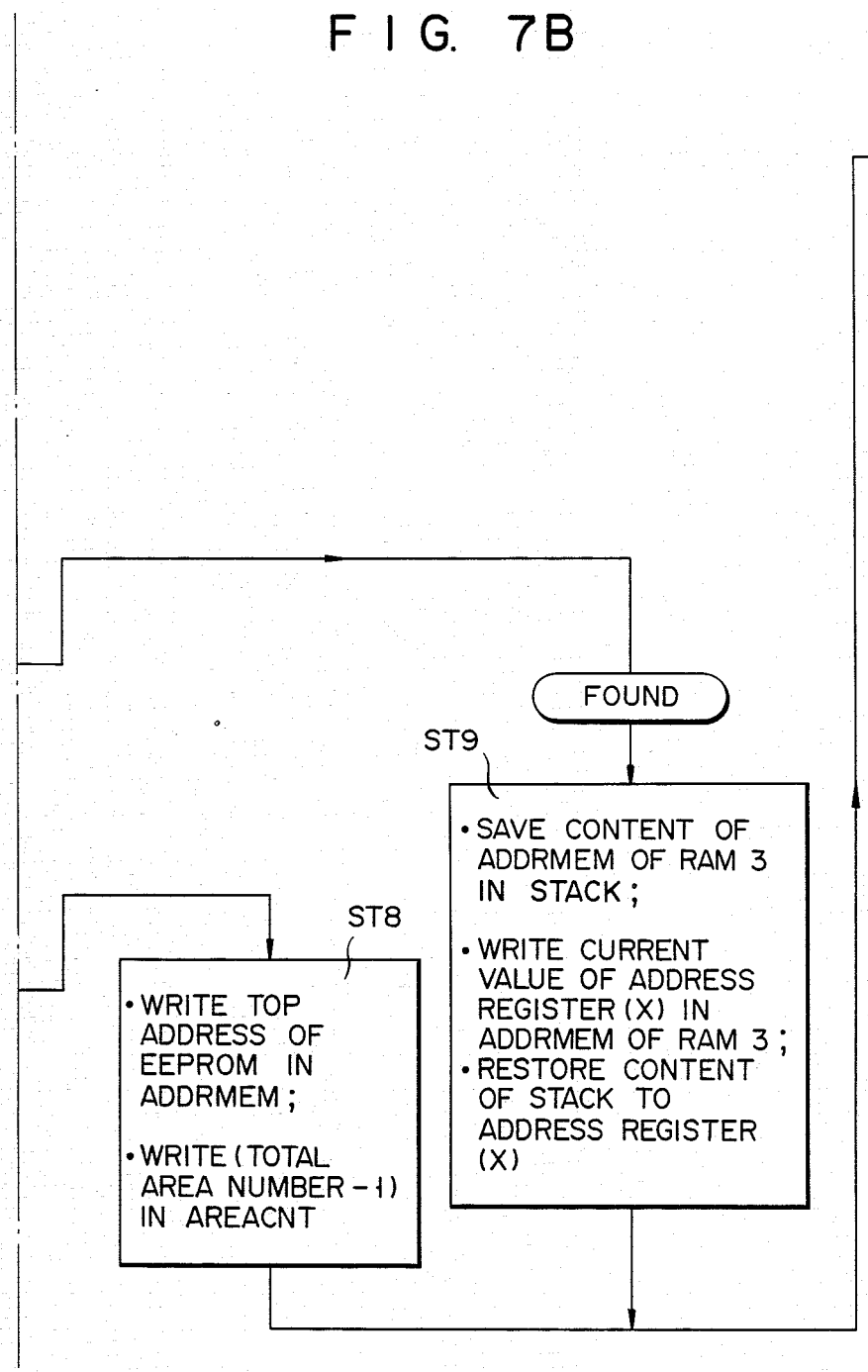
Figure 7C:
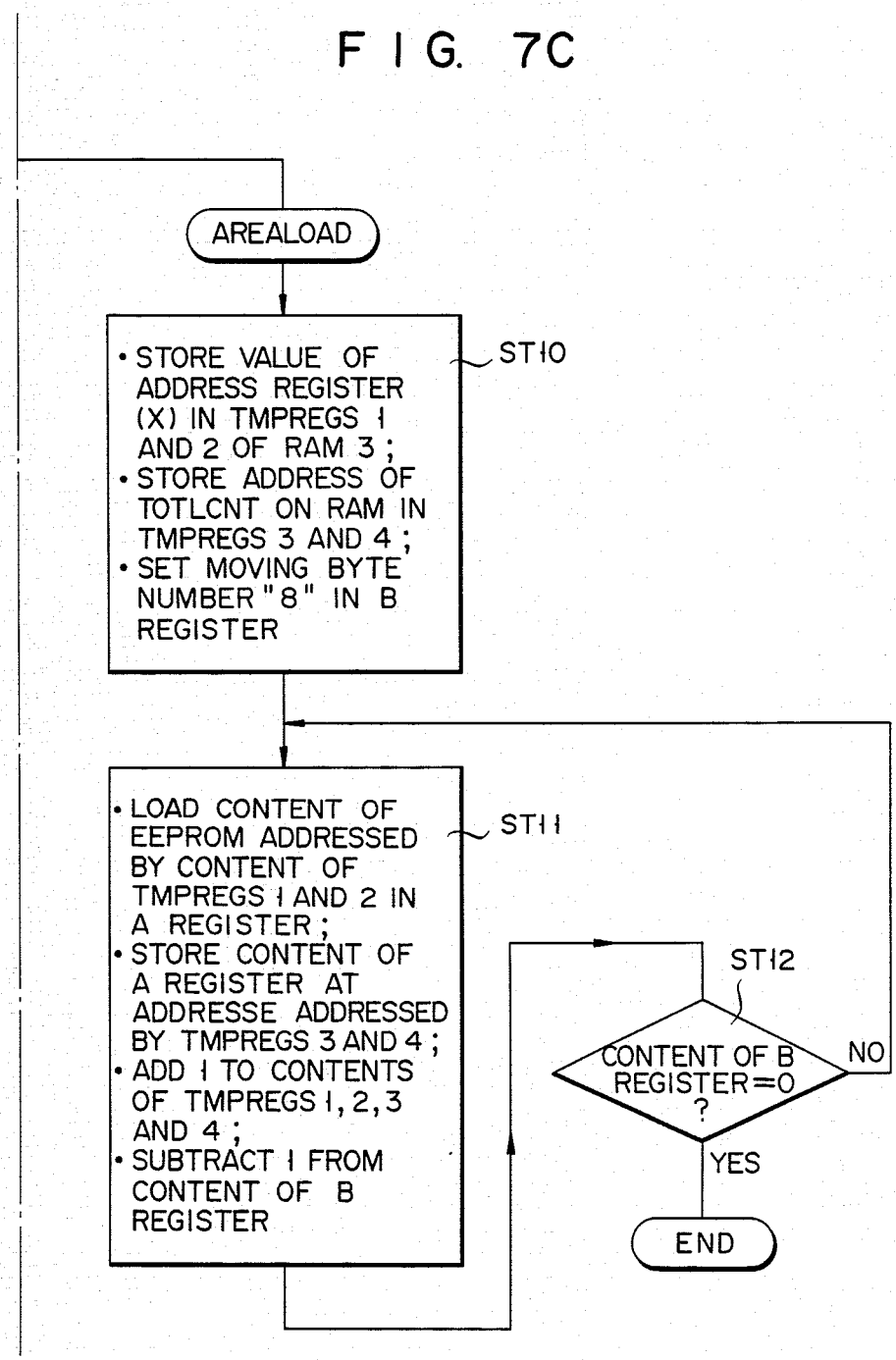

The operation of CPU 1 for reading out previous count data stored in EEPROM 4 in the counter areas of RAM 3 upon turning on of the power source will now be described with reference to the flow charts shown in FIGS. 7A, 7B and 7C. FIGS. 7A, 7B and 7C show an initialization routine for the counter, which includes an operation for searching a current count value stored in EEPROM 4 (ST1 to ST3), an operation for transferring searched data stored in the areas of EEPROM 4 to RAM 3 (ST10 to ST12), and an operation for setting addresses on EEPROM 4 for writing new count-up data again (ST8 to ST9).

More specifically, initialization is performed in routine AREACHK. In other words, in step ST1, the top address of EEPROM 4 is written in area ADDRMEM of RAM 3 and in register X of CPU 1, and a value obtained by subtracting one from the total number of areas of EEPROM 4 (i.e., 255) is written in area AREACNT of RAM 3. In routine CNTREAD of step ST2, TOTLCNT data (area 1) is written from the top address of EEPROM 4 into TEMPREG 1, 2, and 3. Thereafter, in step ST3, TOTLCNT data in next area 2 is read out to register A of CPU 1, and the readout data is compared with the data stored in the TEMPREG 1, 2, and 3 in step ST2 (TOTLCNT data in area 1). If TOTLCNT data in area 1 is larger than that in area 2, the data in area 1 is determined as a current count value, and the flow advances to routine FOUND (ST9). However, if TOTLCNT data in area 2 is larger than that in area 1, the data in area 2 is compared with that in next area 3. Steps ST2 to ST7 form a loop. Data in areas 2 and 3 are compared with each other and if the data in area 3 is larger, data in areas 3 and 4 are compared with each other. In this manner, comparison between TOTLCNT data in areas n and n+1 is repeated until the TOTLCNT data in area n becomes larger, and the current number of prints (maximum value) stored in EEPROM 4 is searched. More specifically, in step ST5, 1 is subtracted from the value of area AREACNT, and it is checked in step ST6 if the value is 0. If the value of area AREACNT is not 0, the top address of next area of EEPROM 4, written in step ST2 in the address register X, is written in the ADDRMEM of the RAM 3 in step ST7. The flow then returns to step ST2. After this processing is repeated, if the value of area AREACNT reaches 0, the top address of EEPROM 4 is written in area ADDRMEM of RAM 3, and a value obtained by subtracting 1 from the total number of areas is written in are AREACNT, in step ST8. In this case, the next area, in which new count data is to be written, is area 1, and the flow advances to step ST10.

The TOTLCNT data in areas n and n+1 are sequentially compared, and ultimately, data in areas 255 and 256 are compared. If the TOTLCNT data in area 256 is larger than that in area 255, the value in area 256 is used as a current value. Note that in this embodiment, the current number of prints stored in EEPROM 4 is searched as a maximum value. However, the current number of prints can be detected such that a minimum value is detected by counting down.

If YES in step ST4, the flow advances to step ST9. In step ST9, the data stored in area ADDRMEM, which represents that address of EEPROM 4 where the current number of prints is stored, is saved in area STACK of CPU 1. Also in this step, the data stored in address register X, which represents the address of the next area, is written in area ADDRMEM of RAM 3. Further, the content of area STACK is recovered to address register X. As a result, the address of EEPROM 4 is set into address register X, and the address of EEPROM 4, which must be accessed next, is written in area ADDRMEM of RAM 3. For instance, the address of EEPROM 4, which must be accessed next, can be given as m+8, where m is that address of EEPROM 4 which stores the current number of prints. The current number of prints searched as described above is transferred to the counter area of RAM 3 in steps ST10 to S12. More specifically, in step ST10, the value of address register X (i.e., the address of EEPROM 4 at which the current number of prints is stored) is stored in areas TMPREG 1 and 2 of RAM 3, the address of TOTLCNT data in RAM 3 is stored in areas TMPREG 3 and 4, and a moving byte number "8" is set in register B in CPU 1, thus preparing for a data transfer operation. The flow then advances to step ST11. In step ST11, the content of EEPROM 4 addressed by the content of areas TMPREG 1 and 2 is loaded to register A, the content of register A is stored at an address, addressed by data stored in areas TMPREG 3 and 4, 1 is respectively added to the contents of areas TMPREG 1, 2, 3, and 4, and 1 is subtracted from the content of register B. Thereafter, it is checked in step ST12 if the content of register B is 0. If the content is 0, the flow ends; otherwise, the flow returns to step ST11 and the above-mentioned processing is repeated until 0 is obtained. In this manner, TOTLCNT, DRMCNT, LiFCNT, DRALCNT, and CNTCTW data in the current value storage areas of EEPROM 4 are transferred to the counter areas of RAM 3 denoted by the same reference symbols, thereby setting a count standby state for counting the number of prints when the power source of the copying machine is turned on.

Figure 8A:
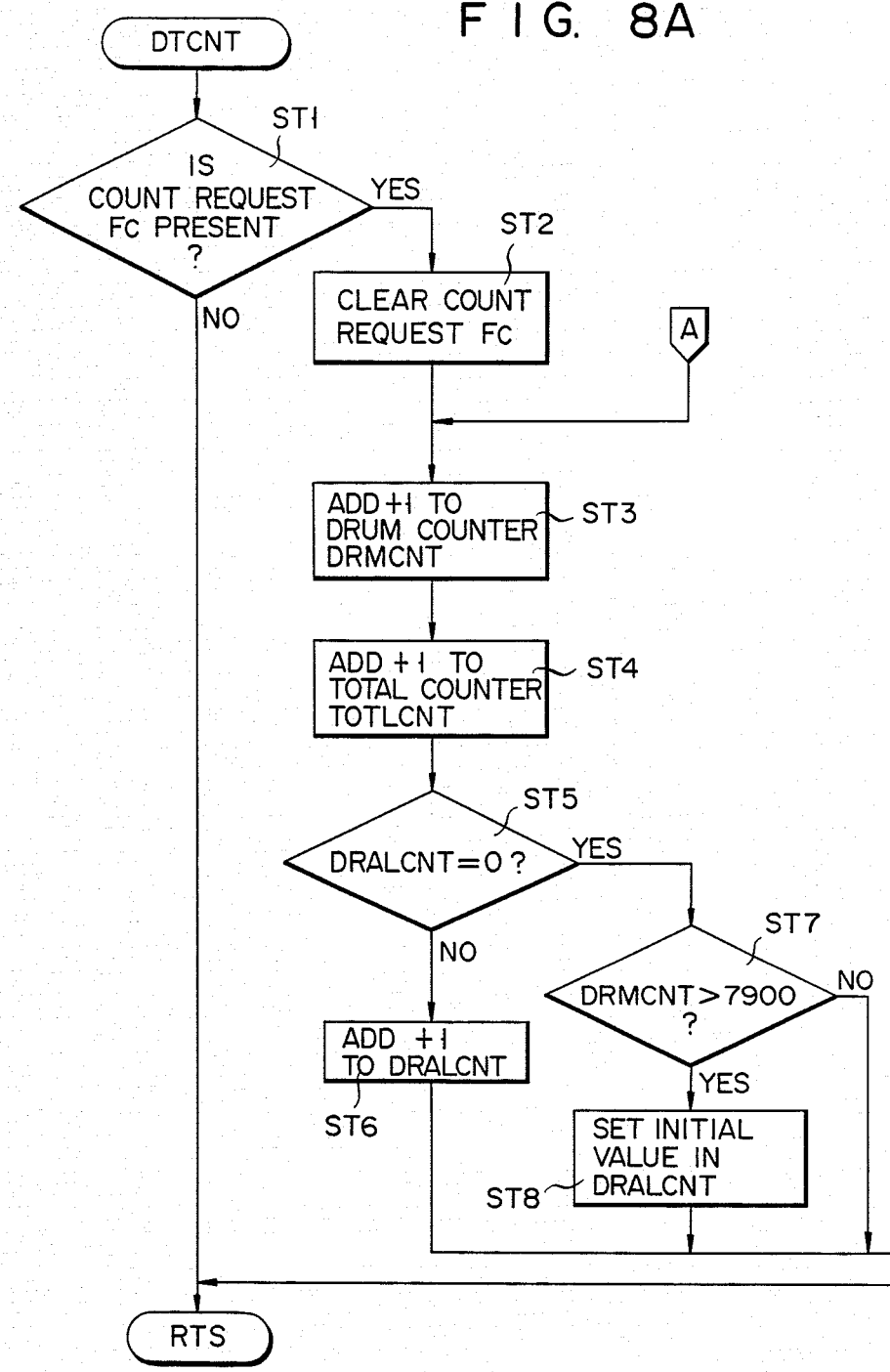

FIGS. 8A and 8B are flow charts showing a count-up operation for rewriting data stored in the counter areas of RAM 3 in accordance with the printing operation. The operation will be explained below with reference to FIGS. 8A and 8B.

When the printing operation for one sheet is completed, count request flag Fc is set in RAM 3 in accordance with a control routine (not shown). Thereafter, data count routine DTCNT shown in FIGS. 8A and 8B is executed. It is checked in step ST1 if count request flag Fc is set. If flag Fc is set, flag Fc is cleared to 0, in step ST2. In step ST3, the DRMCNT data in RAM 3 is incremented by +1 and TOTLCNT data is incremented by +1, and it is checked in step ST5 if the DRALCNT data is 0. Area DRALCNT is used for producing an alarm when a drum set reaches its replacement time. For example, if the life of the drum set is 8,000 sheets, when DRMCNT data exceeds 7,900 sheets, area DRALCNT starts counting. When the count value of area DRALCNT has reached 100 sheets, an alarm is generated. Area DRALCNT is set to be "0" in an initial state. Thus, YES is obtained in step ST5, and the flow advances to step ST7. It is checked in step ST7 if the count value in area DRMCNT exceeds 7,900 sheets. If NO in step ST7, the flow advances to step ST9. If YES in step ST7, an initial value (alarm flag bit - 100) is set in area DRALCNT. Thus, when step ST5 is executed thereafter, NO is obtained in step ST5, and DRALCNT data is incremented by +1 in step ST6. When the count value in area DRALCNT is counted up and reaches 100, "1" is set in the alarm flag bit in area DRALCNT. When this flag is detected in another routine, an alarm for drum set replacement can be produced. If the content of area DRALCNT is not "0", this means that the count value in area DRMCNT exceeds 7,900. Therefore, area DRALCNT is checked to determine if the life of the drum set is about to expire.

In step ST9, it is checked if TOTLCNT data exceeds a predetermined maintenance timing number (e.g., 60000). If the data exceeds the predetermined number, a MAiNTRQ flag (maintenance request flag) preset in CNTCTW data in RAM 3 is set. If this flag is checked, a display indicating that a maintenance is necessary can be made.

Another embodiment will be described with reference to the flow charts shown in FIGS. 8A and 8B, wherein when the size of the paper sheet is different from that of a standard paper sheet and when a ratio of their paper sizes is not an integer, a counting operation is performed in accordance with the ratio in a predetermined cycle, so that the frequency of use of the apparatus can be accurately obtained as a total count in accordance with the sizes of paper sheet. It is first checked in step ST11 if a CNTMORE flag is set in area CNTCTW in RAM 3.

Area CNTCTW has the MAINTRQ flag as described above, a CNTMORE flag for repetitively counting 1, 2, 1, 2, ..., to obtain a count value "1.5" per sheet for a total count when a paper sheet having a size larger than a B4 size is counted, and a B4WCTF flag for discriminating whether a B4-size printing operation corresponds to an odd- or even-number of times. When a large size, e.g., a B4 size of paper sheet is printed, a range of use of the photosensitive body varies as compared with small size of sheets such as B5- or A4-size sheet. When the range of use of the photosensitive body varies, the life of the drum set also varies. The count value is increased in accordance with the size of a sheet.

More specifically, when a B4-size sheet is printed, a count value is increased 50% to obtain a count value "1.5", and when the small size of sheet is printed, it is counted to be "1". In this case, a count value "1.5" can be made for each printing operation in accordance with a ratio of a paper length or paper area. However, this complicates an arithmetic operation. Therefore, in this embodiment, B4-size sheets are counted to be "2" for every other printing operations. Therefore, count values "1" and "2" repetitively appear, and hence, a count value "1.5" is obtained per sheet as a total. The B4WCTF flag in area CNTCTW in RAM 3 is a flag for discriminating odd- and even-number of sheets in the case of B4 printing, as described above. This flag changes like 0, 1, 0, 1, ..., for each printing operation. When "0" is set in this flag, TOTLCNT and DRMCNT data are incremented by one, and when "1" is set therein, they are incremented by two, so that the abovementioned count values "1" and "2" appear alternately. Note that the B4WCTF flag changes only in the case of B4-size printing, and does not change in the case of printing of other small-size sheets. Thus, only in the case of B4-size printing is an irregular counting operation performed.

The irregular counting operation will now be described with reference to FIGS. 8A and 8B.

As described above, it is checked in step ST11 if the CNTMORE flag is set. Since no flag is set in an initial state, NO is obtained in step ST11, and the flow advances to step ST13. It is then checked by a paper size signal input from lead switches 23a to 23c to CPU 1 if the paper size is a B4 size. If the paper size is not the B4 size, the flow advances to step ST17. If it is the B4 size, the B4WCTF flag in area CNTCTW is alternately inverted to be 0, 1, 0, 1, ..., as described above, in step ST14. At this time, if B4WCTF flag is 0, NO is obtained in step ST15, and the flow advances to step ST17. If "1" is set, YES is obtained in step ST15, and the CNTMORE flag in area CNTCTW is set in step ST16. The flow returns to step ST3, the DRMCNT data is incremented by +1, and the TOTLCNT data is incremented by +1 in step ST4. In the case of B4-size sheet, "1" and "2" counting operations are alternately performed for each printing operation, and a count value "1.5" is obtained for each print.

Thereafter, the flow advances to step ST11 via step ST5 through step ST10. In this case, since the CNTMORE flag is set in step ST16 (the irregular counting operation for the B4-size sheet is executed), YES is obtained in step ST11, and the flow advances to step ST12. In step ST12, the CNTMORE flag is cleared, and the flow advances to step ST17. In step ST17, a value "8" is set in area EEPCTW in RAM 3, thereby indicating a write request in EEPROM 4.

FIGS. 9A and 9B are flow charts used when data in RAM 3 is written in EEPROM 4.

A value "8" indicating the write request in EEPROM 4 is set in area EEPCTW of RAM 3 after one printing operation is completed, as described above. Therefore, the content of area EEPCTW is checked (step ST1). If "8" is detected, it is determined that the write request is present, and the flow advances to step ST2. If "0" is detected in step ST1, it is determined that no write request is present. In step ST2, 10 to 20 ms are required for writing one-byte data in terms of the performance of EEPROM 4. Thus, it is checked if a timer for delaying a write access after one-byte data has been written is in operation. If the timer is not operating, the number of prints is written in EEPROM 4. The one-byte data write access is performed as follows. A value obtained by subtracting "1" from the content of area EEPCTW is set in register B, the content of area ADDRMEM is loaded to register X, the contents of registers X and B are added to obtain a storage address of EEPROM 4 and the storage address is saved in STACK, a TOTLCNT address of RAM 3 is added to the value in register B to obtain a load address of RAM 3 and data at the obtained address is loaded to register A, and the content of register A is written at an address of EEPROM 4 addressed by the data in STACK. Steps ST4 and ST5 are executed for sequentially writing one-byte data, as described above.

In step ST6, "1" is subtracted from the content of area EEPCTW for each one-byte data write access, and it is checked in step ST7 if the content of EEPCTW is 0. If the content is 0 (i.e., YES in step ST7), "1" is subtracted from the content of area AREACNT (step ST8), and thereafter, it is checked in step ST9 if the content of AREACNT is 0. If the content of AREACNT is not 0 (i.e., if NO in step ST9), the content of ADDRMEM is rewritten in step ST10 to designate the next area address. If the content of AREACNT is 0 (i.e., YES in step ST9), this means data has been written in area "256". Therefore, in step ST11, the top address of EEPROM 4 is stored in area ADDRMEM, the content obtained by subtracting "1" from the number of all areas, is stored in AREACNT so that data is written again from area 1.

The counted data obtained by the above operation is displayed on display 12 which is arranged on the control panel in accordance with a display routine (not shown). In this embodiment, five contents, i.e., TOTLCNT, DRMCNT, LiFCNT, DRALCNT, and CNTCTW are exemplified. As for retrieval of areas in EEPROM 4, the content of TOTLCNT is compared. More specifically, the other four data are auxiliary data for TOTLCNT data. Therefore, the value of TOTLCNT is principally managed as a current value. When data is written in EEPROM 4, TOTLCNT data is finally written therein. Although TOTLCNT data has three bytes, the least significant byte is written first. This is a protective measure against an interruption of the power source during data write access. For example, if the power source is shut off before all the 8-byte count data are written in EEPROM 4, count data stored in an area immediately preceding an area which has been just subjected to write access is used as a current value when the power source is turned on the next time. In any case, an error is minimized to correspond to a sheet. In this case, if "2" counting operation is made as described above, the error corresponds to two sheets.

When EEPROM 4 is new one, "FF" is set therein, and this state must be altered to be equivalent to a state wherein "00" is written. This can be performed by bit inversion upon data retrieval, data read access, or data write access.

Since the print number data is written in EEPROM 4, a backup battery and a special power source sequence can be omitted, and the arrangement can be simplified. In any state, data will not be lost. If EEPROM 4 is mounted on a circuit board through a socket, even if the circuit board is disabled, the circuit board is replaced and the EEPROM need only be remounted on the new circuit board. Therefore, the already-counted data can be protected.

When a B4-size sheet is printed, a counting operation is performed to alternately count 1, 2, 1, 2, ... to obtain a count value "1.5" as a total. Therefore, the service life of the drum set can be managed in accordance with a range of use of the photosensitive body. Since the counting operation is performed by means of an irregular count, a complicated arithmetic operation is unnecessary, and the counting operation is allowed by a simple arrangement.

The storage area of the EEPROM is divided into "256" areas, and these areas are sequentially shifted for each printing operation. Even though the EEPROM has a limited number of times of write access, the EEPROM can be efficiently used. If the EEPROM is applied to an electronic copying machine, the EEPROM can be reliably rewritten up to its service life.

As described in the above embodiment, an A4 size (210×297 (mm)) is used as a standard Japanese paper size, and an irregular count method is employed when a B4 size sheet (257×364 (mm)) is used as a non-standard paper size. More specifically, the B4-size sheet has an area ratio of 1.5 as compared with the A4-size sheet. In this case, the counting operation can be made 1, 2, 1, 2, ..., in correspondence with one printing operation. In this case, a count value "6" is obtained after four printing operations.

When a LETTER-size sheet is used as a standard sheet, the paper size is 8($\frac{1}{2}$)×11 inches (215.9×279.4 (mm)), and an area ratio with respect to a LEGAL-size sheet (8($\frac{1}{2}$)×14 inches (215.9×355.6 mm) is about 1.3. Therefore, in this case, a counting operation can be irregularly made like 1, 1, 1, 2, 1, 2, 1, 2, 1, 1, ..., and a count value "13" is obtained for ten printing operations.

In Europe, an A4-size sheet (210×297 mm) is used as a standard sheet, and a LEGAL-size sheet (215.9 355.6 mm) is used as a non-standard sheet. In this case, an area ratio of these sheets is about 1.2. Therefore, the counting operation can be irregularly made like 1, 1, 2, 1, 1, ..., and a count value "6" is obtained for five printing operations.

As described above, when the ratio of the sizes of the standard sheet and the non-standard sheet is not an integer, the counting operation is irregularly performed in a cycle corresponding to the ratio. Therefore, with reference to a standard-size sheet, a sheet of another size can be counted at an accurate ratio.

When a RAM counter is used in a conventional apparatus, numerical data below the decimal point must be subjected to arithmetic operation. The counter apparatus of the present invention effectively performs the counting operation, and a count value corresponding to the paper size ratio can be obtained as a total. Therefore, the arrangement of the apparatus can be simplified, and the cost can be reduced.

What is claimed is:

1. A counter apparatus for an image forming apparatus, for counting and managing the number of image forming operations, comprising:
    an EEPROM capable of reading and writing data;
    a RAM capable of reading and writing data;
    signal generating means for generating an execution signal of one image forming operation each time the execution of one image forming cycle for forming one image on one sheet is completed;
    arithmetic operation means for repeating a predetermined number of arithmetic operations corresponding to the image forming operations using data read out from said EEPROM as an initial value, in response to a signal from said signal generating means, said arithmetic operation means including:
    means for storing said initial value read out from said EEPROM into said RAM,
    means for performing said arithmetic operations on said initial value stored in said RAM to produce a result value, and
    means for storing said result value in said RAM; and
    processing means connected between said EEPROM and said RAM for (a) supplying an instruction for reading out data stored in said EEPROM and applying said read out data to said storing means and (b) supplying a further instruction for writing the calculated result obtained by said arithmetic operation means and stored into said RAM into said EEPROM.

2. An apparatus according to claim 1, wherein when a power source is turned on, said processing means retrieves and reads out one of maximum and minimum value data which has been ultimately written in said EEPROM.

3. An apparatus according to claim 1, wherein said processing means writes the calculated result data obtained by said arithmetic operation means at a predetermined address of said EEPROM each time the signal is generated from said signal generating means.

4. An apparatus according to claim 1, wherein said processing means has address designating means for designating different write addresses of said EEPROM each time the calculated result data obtained by said arithmetic operation means is written in said EEPROM.

5. An apparatus according to claim 1, wherein total count data indicating the total number of image forming operations and at least one of unit count data indicating the number of image forming operations of a replaceable drum set and maintenance count data for managing a maintenance timing are written into and read out from said EEPROM.

6. An apparatus according to claim 5, wherein said drum set comprises a photosensitive body and a cleaning device.

7. An apparatus according to claim 1, wherein said EEPROM consists of a plurality of unit areas in each of which count data consisting of a plurality of count data which are entirely controlled on the basis of total count data is written and read out.

8. An apparatus according to claim 7, wherein data write access to said plurality of unit areas of said EEPROM is performed such that addresses of said unit areas are sequentially updated and designated by said address designating means.

9. An apparatus according to claim 7, wherein when the count data consisting of the plurality of count data is written in one unit area of said EEPROM, the total count data which is used as base data for data retrieval among the plurality of count data is ultimately written.

10. An apparatus according to claim 7, wherein the count data consisting of the plurality of count data which is written into and read out from said EEPROM includes flag data for controlling a value calculated by said arithmetic operation means for each image forming operation.

11. An apparatus according to claim 1, further comprising detection means for detecting a size of paper sheet used for forming an image, and wherein when said detection means detects a paper size other than a standard size, a calculation value of said arithmetic operation means necessary for one image forming operation is changed.

12. An apparatus according to claim 11, wherein when said detection means detects a specific size of paper sheet, said arithmetic operation means selectively changes its calculation value to "1" or "2" for each image forming operation.

13. An apparatus according to claim 12, wherein said arithmetic operation means calculates such that the calculation values "1" and "2" for each image forming operation alternately appear.

14. A counter apparatus as in claim 1 wherein:
said processing means includes means for writing result values sequentially produced by said arithmetic operation means into different storage areas of said EEPROM; and
the first-mentioned instruction supplied by said processing means causes the result values last stored in said EEPROM to be read from said EEPROM and stored in said RAM.

15. A counter apparatus as in claim 14 wherein said processing means includes means for searching the contents of said EEPROM for the result values last stored in said EEPROM.

16. A counter apparatus as in claim 15 wherein said searching means locates the highest result values stored in said EEPROM.

17. A counter apparatus as in claim 14 wherein said writing means first fills substantially all of the EEPROM storage areas with result values before writing over result values previously stored in said EEPROM.

18. A counter apparatus as in claim 14 wherein said writing means writes result values last produced by said arithmetic operation means over the oldest result value previously stored in said EEPROM.

19. A counter apparatus as in claim 1 wherein said processing means supplies said first-mentioned instruction in response to a power on condition.

20. A counter apparatus as in claim 19 wherein said processing means supplies said further instruction every time an image is formed on a sheet.

* * * * *